United States Patent [19]

Matsuya

[11] Patent Number: 5,225,676
[45] Date of Patent: Jul. 6, 1993

[54] ELECTROOPTICAL VIEWING APPARATUS CAPABLE OF SWITCHING DEPTH OF FOCUS

[75] Inventor: Miyuki Matsuya, Tokyo, Japan
[73] Assignee: Jeol Ltd., Tokyo, Japan
[21] Appl. No.: 886,623
[22] Filed: May 21, 1992

[30] Foreign Application Priority Data

May 21, 1991 [JP] Japan ................................ 2-115740

[51] Int. Cl.⁵ ............................................ H01J 37/10
[52] U.S. Cl. .............................. 250/311; 250/356 R; 250/398
[58] Field of Search ........... 250/306, 307, 311, 396 R, 250/398

[56] References Cited

U.S. PATENT DOCUMENTS

| | | | |
|---|---|---|---|
| 3,889,114 | 6/1975 | Van Oostrum | 250/306 |
| 3,937,959 | 2/1976 | Namae | 250/310 |
| 4,199,681 | 4/1980 | Namae | 250/310 |
| 4,429,222 | 1/1984 | Yonezawa | 250/311 |
| 4,494,000 | 1/1985 | Shii et al. | 250/311 |
| 4,880,977 | 11/1989 | Tomita et al. | 250/311 |
| 5,013,913 | 5/1991 | Benner | 250/307 |
| 5,032,725 | 7/1991 | Kanda | 250/307 |
| 5,124,556 | 6/1992 | Takashima | 250/396 R |

FOREIGN PATENT DOCUMENTS

| | | |
|---|---|---|
| 36769 | 10/1974 | Japan . |
| 40380 | 11/1974 | Japan . |
| 10740 | 3/1981 | Japan . |
| 159943 | 6/1989 | Japan . |
| 236563 | 9/1989 | Japan . |
| 110742 | 5/1991 | Japan . |

*Primary Examiner*—Bruce C. Anderson
*Attorney, Agent, or Firm*—Webb, Burden, Ziesenheim & Webb

[57] ABSTRACT

An electron microscope capable of switching its depth-of-focus mode between a first and a second mode. The microscope includes an electron gun, a first condenser lens, a second condenser lens, an objective aperture, scan coils, and an objective lens arranged in this order in the direction of travel of the electron beam. The mode is switched by changing the excitation of the first and second condenser lenses and of the objective lens so that the electron beam is in focus at the specimen surface. The distance a between the principal plane of the objective lens and the focal point of the second condenser lens in the first mode and the distance b between the principal plane of the objective lens and the focal point of the second condenser lens in the second mode are set sufficiently larger than the maximum distance $w_2$ between the principal plane of the objective lens and the specimen.

3 Claims, 3 Drawing Sheets

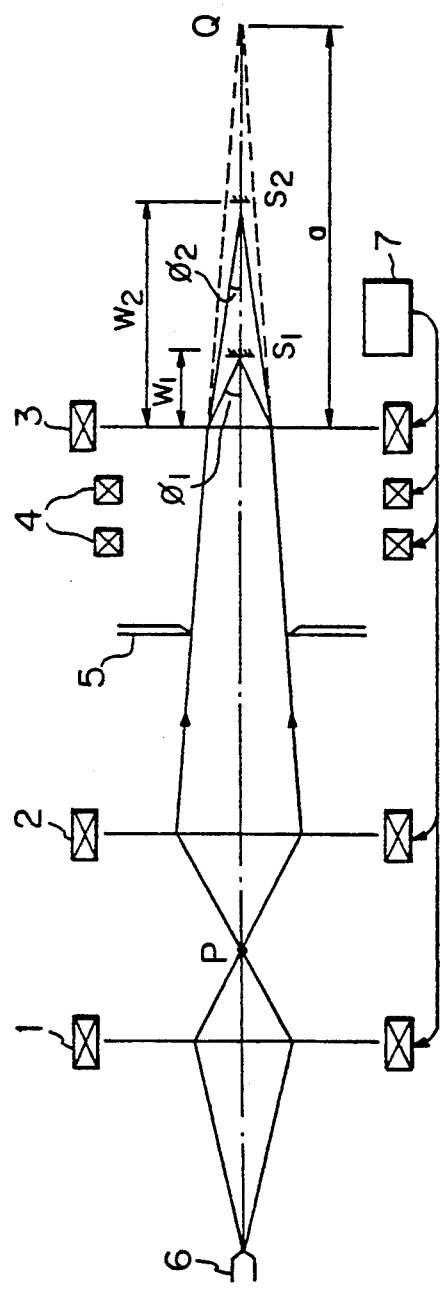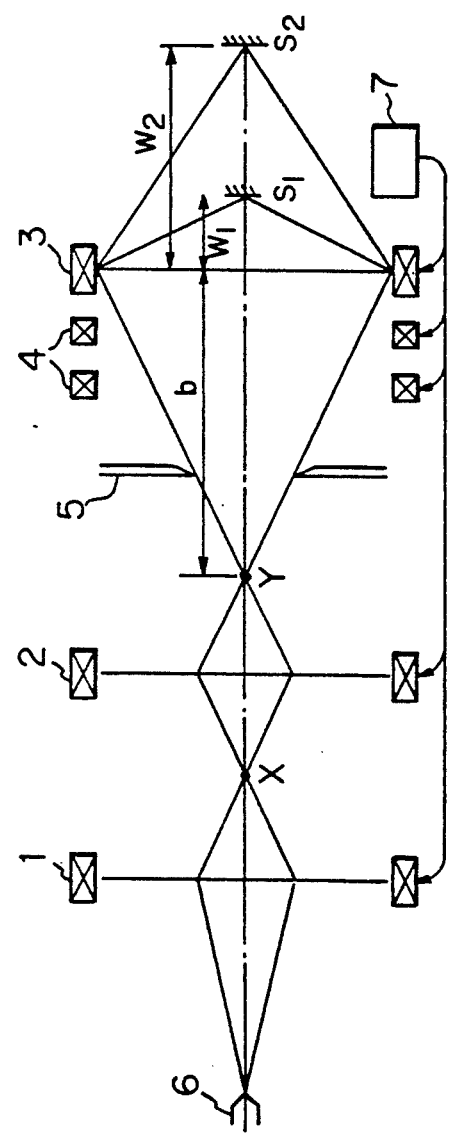
FIG. 1
FIG. 2

ELECTROOPTICAL VIEWING APPARATUS CAPABLE OF SWITCHING DEPTH OF FOCUS

FIELD OF THE INVENTION

The present invention relates to an electrooptical viewing apparatus such as an electron microscope which emits an electron beam and focuses it onto a specimen surface to investigate the topography and morphology of the specimen surface and, more particularly, to an electrooptical viewing apparatus in which the mode of operation is switched to select the depth of focus between different values.

BACKGROUND OF THE INVENTION

Referring to FIG. 5, an electron beam B, or a probe, is caused to hit a specimen S having an irregular surface at a incident angle $\phi$. The probe B has a diameter of $d_p$. The spacing between successive raster lines is $S_r$. In the prior art scanning electron microscope, electron probe microanalyzer, Auger electron spectrometer, or the like, after the probe current $I_p$ illuminating the specimen S has been determined, the electron optics is so controlled that the probe diameter $d_p$ on the surface of the specimen S is reduced, or brought close, to a minimum, as described in Japanese Patent Publication No. 10740/1981 and Japanese Patent Laid-Open No. 159943/1989. As a result, where the magnification M is low, the spacing $S_r$ between the successive raster lines of the electron probe B scanning the surface of the specimen S is much larger than the probe diameter $d_p$. Also, the angle of convergence $\phi$ of the beam B impinging on the specimen S assumes a large value, e.g., 0.5 to $1 \times 10^{-2}$ rad. Therefore, the depth of focus given by $$D_F = \pm (r/M - d_p)/2\phi \quad (1.1)$$

takes a small value. In the above equation, r is the value of blur permitted by the human eye. It is known that this value of blur r is usually 0.2 mm. Where $d_p < < r/M$ and M = 100 x, we have $r/M = 2 \times 10^{-3}$ mm. By substituting $2\phi = 1$ to $2 \times 10^{-2}$ rad., the maximum depth of focus is given by $D_F = \pm 0.1$ to 0.2 mm. Since many specimens investigated by scanning electron microscopy have surface roughnesses exceeding $\pm 0.2$ mm, the depth of focus is not always satisfactory.

In the prior art scanning electron microscope, the objective lens and other lenses project and focus a reduced image of the electron gun onto the specimen, the image being also called a virtual source of the electron gun. Conceivable methods of increasing the depth of focus in this lens system projecting the reduced image of the gun are as follows:

(A) Reducing the diameter of the objective aperture 5 (FIG. 2) located before the objective lens, for example, down to about 10 $\mu$m.

(B) Increasing the working distance, for example, to about 100 mm.

(C) The present mode of operation in which the probe diameter $d_p$ is minimized for any desired value of the probe current $I_p$ is switched to a second mode of operation in which the depth of focus is always maximized for any desired value of the probe current $I_p$ and any desired value of the magnification M.

The above-described method (C) which is based on a new concept is described, for example, in Japanese Patent Laid-Open No. 236563/1989. This method (C) is next described in detail by referring to FIG. 6 which is similar to FIG. 5. The probe diameter $d_p$ is smaller than the spacing $S_r$ between the raster lines on the surface of the specimen S as long as the magnification M is small even if the probe diameter $d_p$ is increased. The method (C) makes use of this principle. Usually, the spacing $S_r$ is so selected that it cannot be perceived by the human eye even if it is magnified at the magnification M ($S_r \cdot M \leq 0.2$ mm) and, therefore, the relation $d_p \cdot M < 0.2$ mm holds. Thus, the blurring caused by the increased probe diameter $d_p$ is not perceived. In this way, the depth of focus is made greatest within the range in which the blur is not perceived.

In an ultra-high resolution scanning electron microscope using a strongly excited objective lens to provide higher magnification than the conventional scanning electron microscope, the gap between the polepieces of the objective lens is made small to reduce the aberration coefficient of the lens. The specimen is placed within this gap. In this case, it is necessary to weaken the excitation of the objective lens to decrease the magnification. For this purpose, any one of the following procedures has been adopted.

(D) The objective lens is deenergized. The focus is adjusted by the condenser lens located at the previous stage.

(E) The excitation of the objective lens is changed according to the magnification. As the magnification is decreased, the excitation of the objective lens is weakened. The focus is adjusted by changing the focal length of the condenser lens positioned ahead of the objective lens. At this time, the beam diameter on the principal plane of the objective lens is limited by the diameter of the aperture of the condenser lens. This method is disclosed, for example, in Japanese Patent Publication No. 40380/1974.

In the method (D) described above, the distance between the condenser lens at the previous stage and the specimen is large, e.g., 150 mm. Therefore, the angle of convergence $\phi$ of the beam impinging on the specimen can be readily set to $1 \times 10^{-3}$ rad. by inserting an aperture 300 $\mu$m in diameter into the principal plane of the condenser lens at the previous stage. In the method (E), it can be seen that the depth of focus can be made large by controlling the condenser lens at the previous stage in such a way that the beam diameter on the principal plane of the objective lens is reduced, as described in Japanese Patent Publication No. 36769/1974. The methods (D) and (E) are primarily intended to permit observation at low magnifications. The above-described increase in the depth of focus is by the secondary effect.

The method (A) described above needs several operations. First, the aperture must be replaced. Then, it is necessary to adjust the axis of the aperture. Where it is desired to increase the depth of focus fivefold, for example, the aperture diameter must be reduced at least by a factor of five. This presents problems concerning manufacturing accuracy. Also, if the aperture is contaminated, the beam passing through the aperture is adversely affected. In an instrument where the focal point of the second condenser lens 2 (FIG. 2) is brought close to the aperture 5 to increase the probe current, the angle of convergence $\phi$ of the beam incident on the specimen increases with increasing the probe current.

Where the method (B) is effected, an operation for varying the working distance is necessitated. In addition, the field of view shifts, because the electric field produced by the secondary electron detector affects the electron probe in a longer space. This effect becomes more conspicuous when the accelerating voltage is reduced.

In the method (C) described above, an ideal control is provided. However, if the focal point of the condenser lens located ahead of the objective lens is situated between the objective lens and the condenser lens at the previous stage and shifts, then the focal length of the objective lens may vary greatly. In this case, it is necessary to correct the rotation of the image in step with the excitation of the objective lens.

In the method (D) described above, the excitation of the objective lens changes from zero to the greatest extent. Therefore, misalignment of the optics takes place. Sometimes, the field of view shifts more than about 50 μm. Furthermore, the efficiency at which secondary electrons are detected deteriorates when the excitation of the objective lens is reduced down to zero, since the secondary electron detector is positioned above the upper polepiece of the objective lens. As a result, the image darkens. Where the focus is adjusted by means of the condenser lens located ahead of the objective lens, if the objective aperture does not exist at the principal plane of this condenser lens, the probe current is varied by the adjustment. This changes the brightness of the image. Consequently, it may be difficult to make the adjustment.

Where the method (E) described above is implemented, if the working distance changes greatly, i.e., if the distance w between the principal plane of the objective lens 3 and the specimen surface is in excess of the focal length f of the objective lens 3 as shown in FIG. 7, then the distance a (see FIG. 1) from the principal plane of the objective lens 3 to the focal point Q of the second condenser lens 2 located ahead of the objective lens 3 as measured in the direction of travel of the beam is given by $$a = fw/(f-w) < 0 \qquad (1.2)$$

That is, the beam spread at the principal plane becomes larger. Under the condition to maintain a large depth of focus, it is impossible to keep up with the focus only by a continuous adjustment of the condenser lens 2. In the case of strongly excited objective lens, a change in the excitation of the objective lens leads to a modification of the lowest magnification attainable. Moreover, a large change in the working distance directly results in a change in the focal length of the objective lens, because the distance between the object lens principal plane and the specimen plane is extremely short. This complicates the movement made to correct the rotation of the image.

The present applicant has already proposed a depth-of-focus-adjusting apparatus for use in an electron microscope or the like in Japanese Patent Application Serial No. 248794/1989. In particular, an electron gun, a first condenser lens, a second condenser lens, an objective aperture, and an objective lens are arranged in this order in the direction of travel of the electron beam. A large depth of focus is obtained by controlling the focal length of the first and second condenser lenses without modifying the relation of the focal length of the objective lens to the probe current. In this proposed apparatus, the mode of operation can be switched from this new mode of operation to the conventional high-resolution mode without changing the working distance or the diameter of the objective aperture to permit various observations.

In this apparatus proposed in Japanese Patent Application Serial No. 248794/1989, when the mode of operation is switched from the conventional high-resolution mode to the large depth-of-focus mode, the image rotates. Also, the image rotates if the position of the specimen relative to the objective lens differs, and if the mode of operation is switched similarly from the conventional mode to the large depth-of-focus mode. However, these rotations of image are not taken into consideration.

SUMMARY OF THE INVENTION

It is an object of the present invention to provide an electrooptical observation apparatus which is capable of switching the depth of focus between different values similarly to the apparatus proposed in the above-cited Japanese Patent Application Serial No. 248794/1989 without presenting the problems concerning the above-described techniques (A)-(E), and in which if the position of the specimen relative to the objective lens can vary over a wide range, and if the mode of operation is switched from the conventional mode to a large depth-of-focus mode without changing the specimen position, the image rotates through substantially the same angle irrespective of the position of the specimen and hence the image rotation can be almost fully corrected by making a correction of the same amount, i.e., the image can be observed substantially without being rotated.

The above object is achieved in accordance with the teachings of the invention by an electrooptical observation apparatus which can switch the depth of focus between different values and which comprises at least an electron gun, a first condenser lens, a second condenser lens, an objective aperture, scan coils, and an objective lens arranged in this order in the direction of travel of an electron beam. The apparatus is capable of switching between first and second modes having different depths of focus by changing the excitation of the first and second condenser lenses and of the objective lens without modifying the focus for the same specimen position. The focal point of the second condenser lens is located between the objective lens and the electron gun when the first mode is established. The focal point of the second condenser lens is located on the side of a specimen when the second mode is established. The distance between the focal point of the second condenser lens and the principal plane of the objective lens in the first mode and the distance between the focal point of the second condenser lens and the principal plane of the objective lens in the second mode are set sufficiently larger than the distance between the principal plane of the objective lens and the remotest specimen position. Thus, when the mode is switched as described above, the angle of correction for the image rotation caused by the switching can be made substantially the same over a wide range of the specimen position.

In accordance with the present invention, the distance between the focal point of the second condenser lens and the principal plane of the objective lens in the first mode and the distance between the focal point of the second condenser lens and the principal plane of the objective lens in the second mode are set sufficiently larger than the distance between the principal plane of the objective lens and the remotest specimen position. Therefore, the image is rotated through substantially the same angle on mode switching, irrespective of the specimen position. Consequently, if every image rotation caused by mode switching is corrected by the same angle over a broad range of working distance, then the resulting image rotation is minimized.

This, if the mode of operation is switched to the large depth-of-focus mode providing a depth of focus that is from a few times to one order of magnitude larger than the depth of focus created in the conventional mode at any arbitrary value of the working distance WD which can change within a wide range, e.g., 10 to 30 mm, then the brightness of the image or the field of image varies only a little. Also, the image rotates through only a little angle, e.g., $\pm 1$ to $1.5°$ or less. When the mode is switched, the focus can be appropriately adjusted without the need to vary the excitation of the objective lens greatly. Hence, the apparatus can be operated with much greater ease.

In one aspect of the present invention, the electrooptical observation apparatus is an electron microscope.

Other objects and features of the invention will appear in the course of the description thereof which follows.

BRIEF DESCRIPTION OF THE DRAWINGS

FIG. 1 is a schematic diagram of the electron beam path from the electron gun of an electrooptical observation apparatus according to the invention to a specimen, and in which the apparatus operates in a large depth-of-focus mode;

FIG. 2 is a diagram similar to FIG. 1, but in which the apparatus operates in the conventional mode;

DETAILED DESCRIPTION OF THE INVENTION

Figure 3:
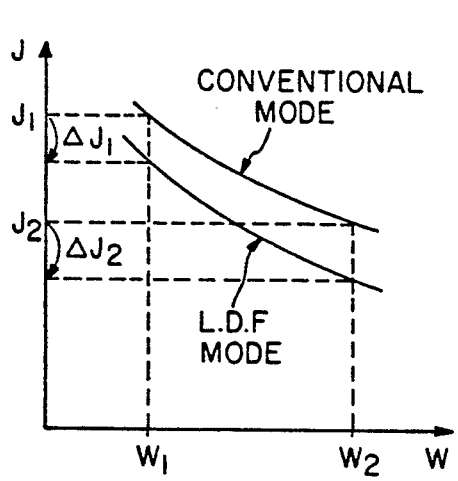
FIG. 3 is a graph in which an excitation parameter J for the objective lens of the apparatus shown in FIGS. 1 and 2 is plotted against the working distance w.

Referring to FIGS. 1 and 2, the path of the electron beam produced in an electron microscope or the like according to the invention is shown, the microscope being capable of switching the depth of focus between different values. The beam is emitted by the electron gun, indicated by 6, and focused onto a specimen. FIG. 1 shows a mode of operation in which the instrument operates at a large depth of focus. This mode is hereinafter referred to as the large depth-of-focus mode. FIG. 2 shows the conventional mode in which the image of the electron gun is demagnified by a large factor and focused onto the specimen to provide high resolution. The instrument comprises a first condenser lens 1 located on the side of the electron gun 6, a second condenser lens 2 mounted behind the first condenser lens 1, an objective lens 3 positioned behind the second condenser lens 2, an objective aperture 5 disposed between the second condenser lens 2 and the objective lens 3, scan coils 4 mounted between the objective aperture 5 and the objective lens 3, a control portion 7, together with the electron gun 6. The control portion 7 is connected with the first condenser lens 1, the second condenser lens 2, the objective lens 3, and the scan coils 4 to provide control of their excitation. $S_1$ and $S_2$ indicate two different positions of the specimen. It is assumed that the distances from these positions $S_1$ and $S_2$ to the position of the principal plane of the objective lens 3 are $w_1$ and $w_2$, respectively. The distance between the principal plane of the objective lens 3 and the specimen is hereinafter referred to as the imaging distance. The distance between the lower surface of the objective lens 3 and the specimen surface is hereinafter referred to as the working distance WD. The ideal, or virtual, focal point of the second condenser lens 2 in the large depth-of-focus mode is indicated by Q. The distance between this ideal focal point Q and the principal plane of the objective lens 3 is a. The focal point Q is fixed irrespective of the values of the probe current and of the accelerating voltage (see Japanese Patent Application Serial No. 248794/1989).

In the large depth-of-focus mode shown in FIG. 1, an image of the electron gun 6 is once focused at a position P by the first condenser lens 1. The electron beam emerging from the point P is focused toward the point Q by the second condenser lens 2. This focused beam is incident on the objective lens 3 in such a way that the probe current is limited by the objective aperture 5. The beam is then focused onto the specimen at the specimen position $S_1$ or $S_2$ by the objective lens 3. Since the beam diameter on the principal plane of the objective lens is reduced, the angles $\phi_1$ and $\phi_2$ that the beam makes to the optical axis when the electron probe is focused at the positions $S_1$ and $S_2$, respectively, are reduced. As a result, the depth of focus can be made larger than that obtained in the conventional mode shown in FIG. 2. When the mode of operation is switched from the conventional mode to the large depth-of-focus mode, the excitation of the objective lens is changed to keep the focus condition for the position of the specimen from $S_1$ to $S_2$. After the switching of the mode, the excitation of the objective lens 3 is maintained constant. The scan coils 4 deflect the electron probe to scan the specimen plane $S_1$ or $S_2$. When the specimen plane is fixed at $S_1$ or $S_2$ and the mode of operation is switched from the conventional mode shown in FIG. 2 to the large depth-offocus mode shown in FIG. 1, the excitation of the first condenser lens 1, the second condenser lens 2, and the objective lens 3 is changed by the control portion 7. The focal point of the first condenser lens 1 is moved from a position X to the position P. The focal point of the second condenser lens 2 moves from a position Y located ahead of the specimen planes $S_1$ and $S_2$ to the position Q that is behind the objective lens 3. Let b be the distance between the position Y and the principal plane of the objective lens 3. The excitation of the objective lens 3 is so controlled that either the specimen plane $S_1$ or $S_2$ is in focus. When the mode of operation is switched or the specimen position is switched in this way, the excitation of the objective lens 3 changes, thereby rotating the image. This rotation is corrected by varying the scan signals supplied to the scan coils 4 by well-known techniques.

In the condition of FIG. 2, it is assumed that the focal length of the objective lens 3 takes values of $f_{N1}$ and $f_{N2}$ at the specimen positions $S_1$ and $S_2$, respectively. These focal lengths $f_{N1}$ and $f_{N2}$ are given by $$f_{N1} = w_1 \cdot b/(w_1 + b) \tag{2.1}$$

$$f_{N2} = w_2 \cdot b/(w_2 + b) \tag{2.2}$$

In the condition shown in FIG. 1, let $f_{L1}$ and $f_{L2}$ be the values of the focal length of the objective lens at the specimen positions $S_1$ and $S_2$, respectively. The control portion 7 controls the objective lens 3 in such a manner that the following relations are satisfied:

$$f_{L1} = w_1 \cdot a/(a - w_1) \tag{2.3}$$

$$f_{L2} = w_2 \cdot a/(a - w_2) \tag{2.4}$$

At this time, if the distances a and b from the principal plane of the objective lens 3 to the focal points Q and Y, respectively, of the second condenser lens 2 are sufficiently large compared with the distances $w_1$ and $w_2$, then it can be seen from equations (2.1)–(2.4) that the following relationships hold:

$$f_{N1} \leqq f_{L1}, \quad f_{N1} \cdot f_{L1} \sim w_1 \tag{2.5}$$

$$f_{N2} \leqq f_{L2}, \quad f_{N2} \cdot f_{L2} \sim w_2 \tag{2.6}$$

In the illustrated example, the distances a and b are both positive. As an example, expanding equations (2.1) and (2.3) up to the first order with respect to $w_2/b$ and $w_2/a$ gives rise to $$f_{N1} = w_2/\{1+(w_1/b)\} = w_1 \{1-(w_1/b)+ \ldots\} \tag{2.7}$$

$$f_{L1} = w_1/\{1+(w_1/a)\} = w_1 \{1-(w_1/a)- \ldots\} \tag{2.8}$$

Accordingly, in the specimen plane $S_1$, the change in the focal length caused by the switching of the mode is given by $$\Delta f_1 = f_{L1} - f_{N1} \simeq w_1 \{(w_1/a)+(w_1/b)\} \tag{2.9}$$

$$\Delta f_2 = f_{L2} - f_{N2} \simeq w_2 \{(w_2/a)+(w_2/b)\} \tag{2.10}$$

Within the range of the imaging distance w of interest, an excitation parameter J is defined as $$J = N I/(V^*)^{\frac{1}{2}} \ [AT/V^{\frac{1}{2}}] \tag{2.11}$$

where N is the number of turns of the coil of the objective lens 3, I is the excitation current, and $V^*$ is the relativistic corrected value for the accelerating voltage V. For an ordinary objective lens, within the range of the distance w and within the range of the working distance WD, the relation of the excitation parameter J to the focal length f of the objective lens 3 can be approximately given by $$J = 40 f^{-0.63} \ (f \text{ is expressed in mm}) \tag{2.12}$$

When the focal length changes by $\Delta f$, the excitation parameter J changes by $$J = J[(1+\Delta f/f)^{-0.63} - 1] \tag{2.13}$$

By substituting numerical values $$a = b = 200 \text{ mm}, \ w_1 = 20 \text{ mm, and } w_2 = 40 \text{ mm} \tag{2.14}$$

into equations (2.7) and (2.9), we have $$f_{N1} \simeq 18 \text{ mm}, \ \Delta f_1 = 4 \text{ mm} \tag{2.15}$$

Similarly, we have the following relations from equations (2.8) and (2.10):

$$f_{N2} \simeq 32 \text{ mm}, \ \Delta f_2 = 16 \text{ mm} \tag{2.16}$$

It can be seen from equation (2.13) that the difference between the excitation parameters produced in the large depth-of-focus mode and in the conventional mode, respectively, at the imaging distance $w_1$ is given by $$\Delta J_1 = J_1 \times [(1+\Delta f_1/f_{N1})^{-0.63} - 1] = -0.768 \tag{2.17}$$

Similarly, this distance at the imaging distance $w_2$ is given by $$\Delta J_2 = J_2 \times [(1+\Delta f_2/f_{N2})^{-0.63} - 1] = -1.016 \tag{2.18}$$

In the conventional mode, substituting equations (2.15) and (2.16) into equation (2.12) results in $$J_1 = 6.47, \ J_2 = 4.51 \ [AT/V^{\frac{1}{2}}] \tag{2.19}$$

See FIG. 3. A relatively large difference exists between $\Delta J_1/J_1$ and $\Delta J_2/J_2$, but both $\Delta J_1$ and $\Delta J_2$ change only a little. The difference between $\Delta J_2$ and $\Delta J_1$ is given by $$\Delta J_2 - \Delta J_1 = -0.248 \ [AT/V^{\frac{1}{2}}] \tag{2.20}$$

Figure 4:
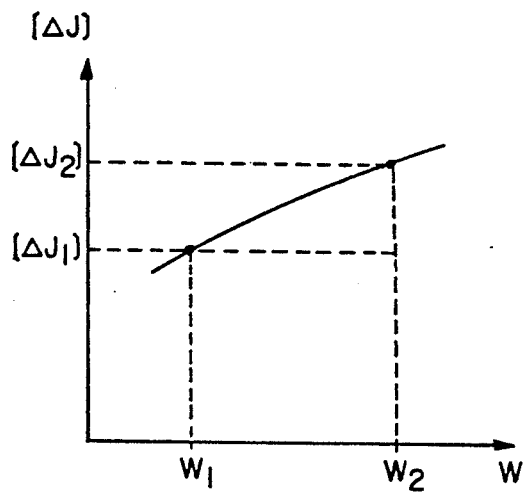
FIG. 4 is a graph in which the absolute value of a differential excitation parameter $\Delta J$, produced when the mode of operation of the apparatus shown in FIGS. 1 and 2 is switched, is plotted against the working distance w.
Figure 5:
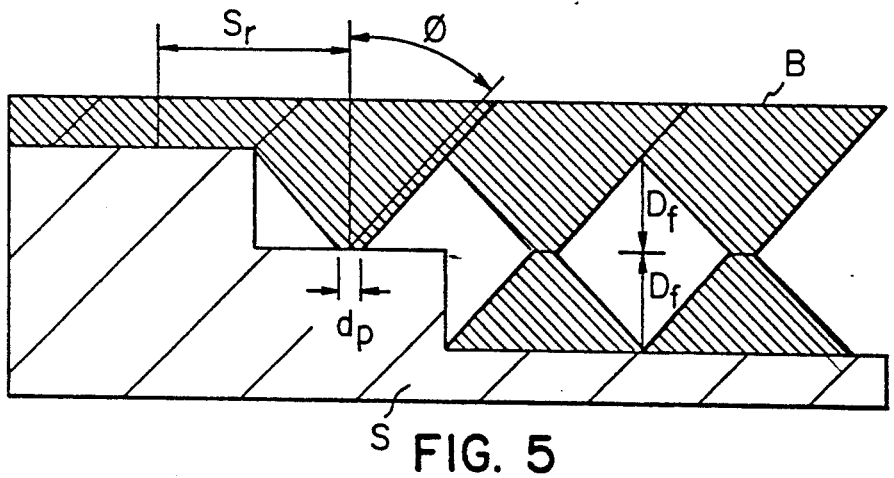
FIG. 5 is a cross-sectional view of a specimen having an uneven surface investigated by an electron beam or a probe produced by a conventional electrooptical observation apparatus, for illustrating the incident angle of divergence of the beam, the diameter of the probe on the specimen, and the spacing between successive raster lines when the electron optics is so controlled that the probe diameter on the specimen assumes or approaches its minimum value.
Figure 6:
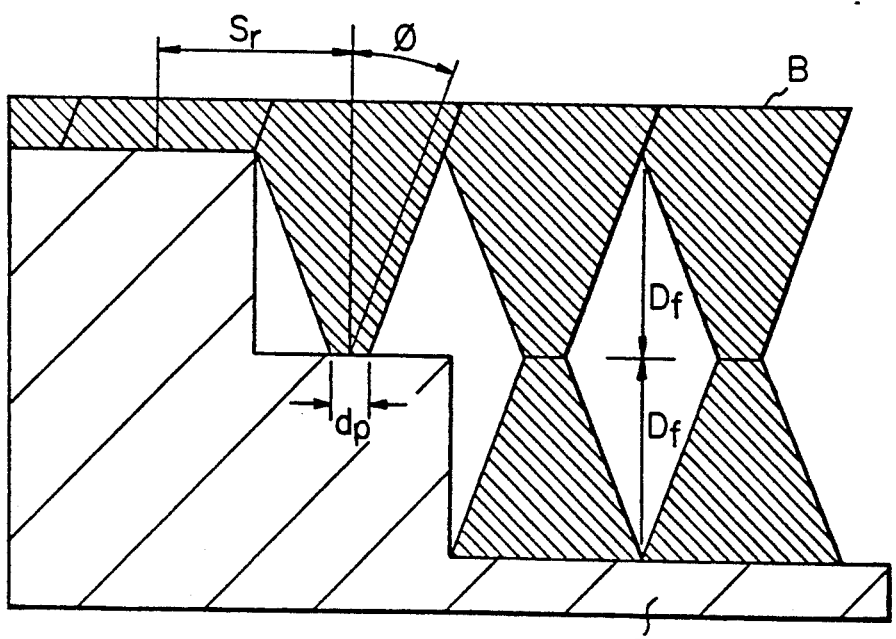
FIG. 6 is a cross-sectional view similar to FIG. 5, but in which the depth of focus is always maximized, irrespective of both probe current and magnification, by other known techniques.
Figure 7:
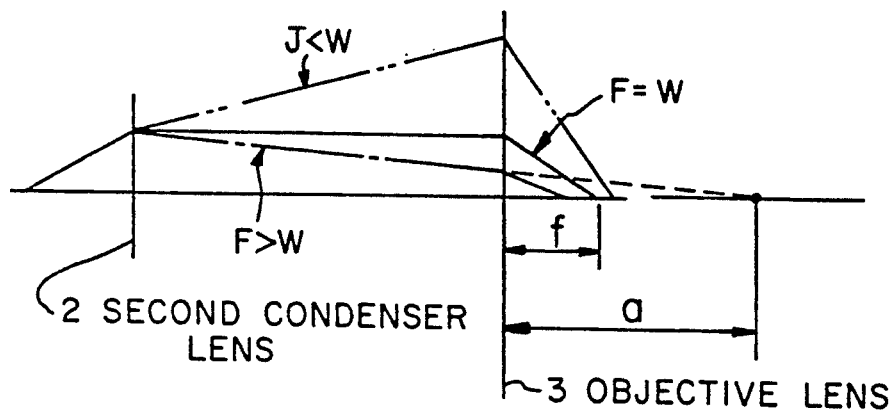
FIG. 7 is a ray diagram showing the imaging distance w, the focal length f of the objective lens, and the beam path.

See FIG. 4. That is, $|\Delta J_2 - \Delta J_1|$ is sufficiently small compared with $|\Delta J_1|$ and $|\Delta J_2|$.

We now discuss the relation between the excitation parameter J for the objective lens 3 and the angle $\theta$ through which the image is rotated. As is well known, the angle $\theta$ is given by $$\theta = \sqrt{e/8mV^*} \int_{z_0}^{z_i} B(z) dz \tag{2.21}$$

where e is the electric charge of an electron, m is the mass of an electron, z is a Z coordinate taken on the optical axis, and B(z) is the on-axis magnetic field distribution in the Z-direction. $z_i$ is the position of the image plane. $z_0$ is the position of the object plane. It is known ("Electron Optics", Chapter 4, page 41, by Katsumi Ura, Iwanami Publishing Company, Japan) that if the positions $z_0$ and $z_i$ are outside the range which gives the relation $|B(z)| > 0$, the following relation $$\theta = 0.1863 \times N I/(V^*)^{\frac{1}{2}} = 0.1863 J \ [rad.] \quad (2.22)$$

Therefore, when the mode of operation is switched from the conventional mode to the large depth-of-focus mode, the excitation parameter J changes by $\Delta J_1$ and $\Delta J_2$ at the imaging distances $w_1$ and $w_2$, respectively, as indicated by the equations (2.17) and (2.18). It can be seen from equation (2.22) that the angle changes in response to the excitation parameter by $$\Delta\theta_1 = 0.1863 \Delta J_1 \simeq -0.143 \ [rad.] \quad (2.23)$$

$$\Delta\theta_2 = 0.1863 \Delta J_2 \simeq -0.189 \ [rad.] \quad (2.24)$$

That is, the image rotates through 8.2 to 10.8 degrees.

The imaging distance w assumes an appropriate value between the imaging distances $w_1$ and $w_2$ ($w_1 < w < w_2$). When the mode of operation is switched from the conventional mode to the large depth-of-focus mode, the control portion 7 controls the scan coils 4 in such a manner that the image does not rotate. For example, the angle $$(8.2 + 10.8)/2 = 9.5 \ [deg.] \quad (2.25)$$

that is the average of the angles $\Delta\theta_1$ and $\Delta\theta_2$ is corrected. The angular position of the image is corrected by the same angle at every other position w between $w_1$ and $w_2$. In this scheme, if the imaging distance changes by $\pm 10$ mm between the imaging distances $w_1$ and $w_2$, the angle through which the image rotates when the mode of operation is switched from the conventional mode to the large depth-of-focus mode is only $\pm 1.3$ degrees.

We have thus far described numerical examples of the equation (2.14) for both large depth-of-focus mode and conventional mode with respect to the distance a between the principal plane of the objective lens 3 and the focal point Q of the condenser lens 2, the distance b between the principal plane of the objective lens 3 and the focal point Y of the condenser lens 2, the imaging distance $w_1$ between the principal plane of the objective lens 3 and the specimen position $S_1$, and the imaging distance $w_2$ between the principal plane of the objective lens 3 and the specimen positions $S_2$. As described above, the imaging distance w varies widely. When the mode of operation is switched from the conventional mode to the large depth-of-focus mode without changing the imaging distance, every image preferably experiences little rotation, irrespective of the specimen position, by performing the same amount of correction for image rotation. For this purpose, the distances a and b should be sufficiently larger than the maximum imaging distance $w_2$. We have empirically found that the problem of image rotation is solved where the distances a and b are at least three times as large as the maximum imaging distance. In the above numerical example, the distances a and b are 5 fives as large as the maximum imaging distance.

In the above numerical example, the excitation of the objective lens 3 is changed only by $$\Delta J_1/J_1 = 0.12, \ \Delta J_2/J_2 = 0.23 \quad (2.26)$$

Therefore, the degree of the axial misalignment caused by the modification of the excitation parameter J is smaller (about one third) than the degree of the axial misalignment produced when the objective lens 3 is deenergized. This change in the excitation does not affect the efficiency at which secondary electrons are detected. Furthermore, if the focus is adjusted finely by controlling the condenser lens 2 alone, the probe current is affected only a little, because the distance a is large. In consequence, the problem with the prior art technique (D) described above is solved.

In addition, no strongly excited objective lens is used, unlike the prior art techniques (E). Therefore, if the excitation of the objective lens 3 is varied, the minimum magnification attainable does not change. Accordingly, if the mode of operation is switched to the large depth-of-focus mode at any of the values of the working distance lying in a wide range, the focus is adjusted appropriately because the excitation of the objective lens 3 changes correspondingly. In addition, the image rotation caused by the switching of the mode is held down within $\pm 1.3°$ by a simple given correction for image rotation when the working distance changes by $\pm 10$ mm. In this way, the problem with the prior art techniques (E) is solved. The straightforwardness of the correction for image rotation solves the problems with the prior art technique (C).

Further, the problems with the prior art techniques (A) and (B) are solved in the present invention, since the depth of focus $D_F$ is set to a large value on the principle described in the above-cited Japanese Patent Application Serial No. 248794/1989.

Figure 8A:
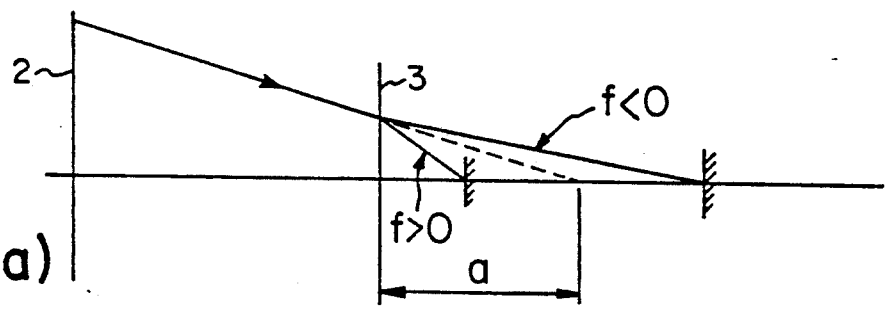
FIG. 8(a) is a ray diagram of the electrooptical observation apparatus shown in FIGS. 1 and 2, for showing the sign of the focal length f of the objective lens when the apparatus is operating in the large depth-of-focus mode and the distance a between the objective lens and the second condenser lens is small compared with the working distance.
Figure 8B:
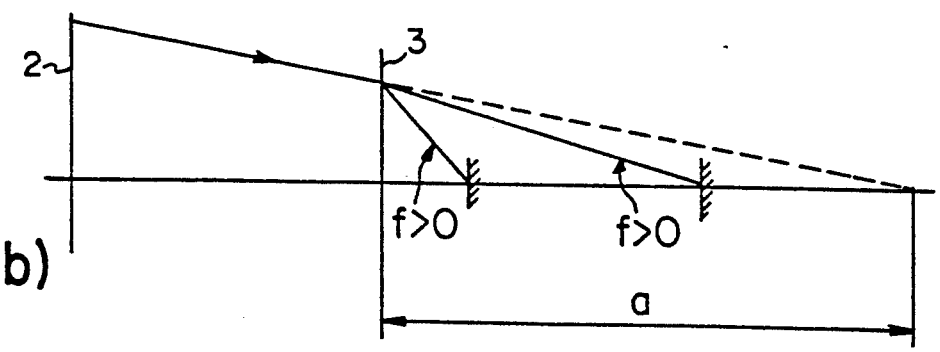
FIG. 8(b) is a diagram similar to FIG. 8(a), but in which the distance a is large compared with the working distance.

In FIG. 8(a), the distance a is relatively small in the large depth-of-focus mode. In FIG. 8(b), the distance a is relatively large in the large depth-of-focus mode. As can be seen from these figures, the focal length f of the objective lens 3 is kept positive even if the imaging distance w is varied over a wide range, since the distance a is sufficiently large compared with the imaging distance w.

In the novel electron microscope, once the focus is adjusted in the conventional mode, if the mode of operation is then switched to the large depth-of-focus mode, the control portion 7 modifies the excitation of the condenser lenses 1, 2, and of the objective lens 3, so that the focus is automatically readjusted. When the specimen position varies in the large depth-of-focus mode, the focus may be adjusted without varying the probe current by the method described in Japanese Patent Application Serial No. 2093/1991. Alternatively, the focal length of one of the condenser lenses 1 and 2 may be varied to adjust the focus. In this case, the image will not rotate, since the excitation of the objective lens 3 is fixed.

While a preferred embodiment of the inventive electrooptical observation apparatus capable of switching the depth of focus such as an electron microscope has been described thus far, it is to be understood that the present invention is not limited to this embodiment and that various changes and modifications are possible. In the above description, the point Q (FIG. 1) is treated as a fixed point. It is also possible to change the position Q together with the imaging distance w to further reduce the image rotation of $\pm 1.3°$, for example, below 1°, within the range in which the depth of focus is not affected greatly.

As described above, in the novel electrooptical apparatus capable of switching the depth of focus such as an electron microscope, the distance between the focal point of the second condenser lens and the principal plane of the objective lens in the conventional mode and the distance between the principal plane of the objective lens and the focal point of the second condenser lens in the large depth-of-focus mode are set sufficiently large compared with the distance between the principal plane of the objective lens and the remotest position of the specimen. Therefore, the image is rotated through substantially the same angle on mode switching, irrespective of the specimen position. Consequently, if every image rotation caused by mode switching is corrected by the same angle over a broad range of working distance, the resulting image rotation is minimized.

Thus, if the mode of operation is switched to the large depth-of-focus mode providing a depth of focus that is from a few times to one order of magnitude larger than the depth of focus created in the conventional mode at any arbitrary value of the working distance which can change within a wide range, e.g., 10 to 30 mm, the brightness of the image or the field of image varies only a little. Also, the image rotates through only a little angle, e.g., ±1 to 1.5° or less. When the mode is switched, the focus can be appropriately adjusted automatically without the need to vary the excitation of the objective lens greatly, and readjustment of the excitation is not necessary. Hence, the apparatus can be operated with much greater ease. Furthermore, the problems with the prior art techniques (A)–(E) for increasing the depth of focus are all solved.

Having thus described my invention with the detail and particularity required by the Patent Laws, what is claimed to be protected by Letters Patent is set forth in the following claims.

What is claimed:

1. An electrooptical observation apparatus comprising at least an electron gun, a first condenser lens, a second condenser lens, an objective aperture, scan coils, and an objective lens which are arranged in this order in the direction of an electron beam, comprising: a means for switching between a first mode and a second mode having different depths of focus by changing the excitation of the first and second condenser lenses and of the objective lens without modifying the focus for the same specimen position, the focal point of the second condenser lens being located between the objective lens and the electron gun when the first mode is established, the focal point of the second condenser lens being located behind a specimen when the second mode is established, the distance between the focal point of the second condenser lens and the principal plane of the objective lens in the first mode and the distance between the focal point of the second condenser lens and the principal plane of the objective lens in the second mode being set sufficiently larger than the distance between the principal plane of the objective lens and the remotest specimen position, whereby when the mode is switched as described above, the angle of correction for the image rotation caused by the switching is made substantially the same over a wide range of the specimen position.

2. The electrooptical observation apparatus of claim 1, wherein said electrooptical observation apparatus is an electron microscope.

3. The electrooptical observation apparatus of claim 1, wherein the distance between the focal point of the second condenser lens and the principal plane of the objective lens in the first mode and the distance between the focal point of the second condenser lens and the principal plane of the objective lens in the second mode are at least three times as large as the distance between the principal plane of the objective lens and the remotest specimen position.

* * * * *

UNITED STATES PATENT AND TRADEMARK OFFICE
CERTIFICATE OF CORRECTION

PATENT NO. : 5,225,676
DATED : July 6, 1993
INVENTOR(S) : Miyuki Matsuya It is certified that error appears in the above-identified patent and that said Letters Patent is hereby corrected as shown below:

Cover page, after [73] Assignee:, "Jeol Ltd." should read --JEOL Ltd.--.
and
after Foreign Application Priority Data, "2-115740 should read --3-115740--.

Column 1 Line 18 "a incident" should read --an incident--.

Column 5 Line 6 "This" should read --Thus--.

Column 9 Line 2 after "relation" insert --holds:--.

Column 9 Line 60 "5 fives" should read --5 times--.

Signed and Sealed this

Fifteenth Day of March, 1994

*Attest:*

BRUCE LEHMAN

*Attesting Officer*     *Commissioner of Patents and Trademarks*